United States Patent [19]

Kurosawa

[11] Patent Number: 4,504,333
[45] Date of Patent: Mar. 12, 1985

[54] METHOD OF MAKING FIELD OXIDE REGIONS

[75] Inventor: Kei Kurosawa, Tokyo, Japan

[73] Assignee: Tokyo Shibaura Denki Kabushiki Kaisha, Kawasaki, Japan

[21] Appl. No.: 384,946

[22] Filed: Jun. 4, 1982

[30] Foreign Application Priority Data

Jun. 10, 1981 [JP] Japan .............................. 56-88256

[51] Int. Cl.³ .............................................. H01L 21/22
[52] U.S. Cl. .................................... 148/187; 29/571; 29/576 W; 29/578; 29/580
[58] Field of Search .................... 29/571, 576 W, 578, 29/580; 148/187

[56] References Cited

U.S. PATENT DOCUMENTS

| | | | |
|---|---|---|---|
| 3,646,665 | 4/1972 | Kim ....................................... | 29/571 |
| 3,766,637 | 10/1973 | Norris et al. ........................... | 29/571 |
| 4,335,391 | 6/1982 | Morris .................................... | 357/41 |
| 4,407,851 | 10/1983 | Kurosawa et al. ..................... | 29/571 X |
| 4,419,813 | 12/1983 | Iwai ...................................... | 29/571 X |

OTHER PUBLICATIONS

Preprint for 28th Applied Physics Lecture Meeting, 1981, p. 592, 31a-N-5 (1981) by Kuroaswa et al.

Primary Examiner—G. Ozaki
Attorney, Agent, or Firm—Oblon, Fisher, Spivak, McClelland & Maier

[57] ABSTRACT

A semiconductor device wherein an oxide film constituting a field region is buried in a semiconductor substrate to make the surface of the field region flush with the top surface of an element region, which is characterized in that another insulating film is buried between the oxide film and the element region. Said another insulating film allows the formation of a larger contact hole.

A method for manufacturing such a semiconductor device which is characterized in making use of V-grooves formed in a lift-off process.

3 Claims, 16 Drawing Figures

METHOD OF MAKING FIELD OXIDE REGIONS

BACKGROUND OF THE INVENTION

This invention relates to a semiconductor device in which a comparatively thick insulating film is buried or formed in a field region and also a method of manufacturing such a semiconductor device.

In a semiconductor device using silicon as the semiconductor, more particularly a MOS semiconductor device, a thick insulating film is formed in a so-called field region between adjacent elements in order to eliminate defective insulation due to parasitic channels and also reduce the parasitic capacitance.

The inter-element isolation in such a semiconductor device, is attained by a well-known selective oxidation method. In this method, the element formation region is covered with an oxidizable mask, typically a silicon nitride film, and a thick oxide film is selectively formed over the field region through high temperature oxidation. According to this selective oxidation method, however, the field oxide film protrudes in the form of a bird's beak from the end of the silicon nitride film during the high temperature oxidation. This causes dimensional errors of the element formation region and also prevents high density integration of integrated circuits.

In another aspect, in the prior art selective oxidation method, a surface step of about one half of the field oxide film (which is about 0.7 to 1.0 μm) in height is formed in the field region and element formation region after the formation of the field oxide film. This step remains as such in the subsequent steps to reduce the precision of the subsequent lithography. Also, the reliability of the metal lead is reduced at the step.

A BOX (buried oxide) method is also well known as a method which can eliminate the bird's beak and permits a flat buried field oxide film to be obtained.

The BOX method will now be briefly described with reference to FIG. 1. As shown in FIG. 1(A), a silicon substrate 1 is prepared, and it is selectively etched to a desired depth corresponding to the field film thickness with the element formation region covered with a mask 2 by the ordinary photoetching process. Then, as shown in FIG. 1(B) an impurity of the same conductivity type as the silicon substrate for the prevention of field inversion, for instance boron 3 in case of a P-type substrate, is injected by ion implantation into the field region by using the same mask 2. Subsequently, as shown in FIG. 1(C) a silicon oxide film 4 to be buried in the field region is formed by using a lift-off process. The lift-off process may be carried out as follows. In the first place, a plasma CVD SiO$_2$ film is deposited over the entire surface of the wafer shown in FIG. 1(B). Then, etching for about one minute is done using, for instance, ammonium fluoride. As a result, a portion of the plasma CVD SiO$_2$ film deposited on the side surfaces of the raised portion formed at the boundary between the field region and element formation region is selectively removed because the etching speed for this portion is higher than that for the rest of the plasma CVD SiO$_2$ film formed on the non-raised or flat portion of the wafer by 3 to 20 times. The mask remaining on the element formation region is subsequently removed, whereby the portion of the plasma CVD SiO$_2$ film remaining on the mask is also removed. In this way, the plasma CVD SiO$_2$ film is left only in the field region. A narrow groove 5 having a V-shaped sectional profile is formed at the boundary between the field region and element formation region as shown in FIG. 1(C).

Afterwards, as shown in FIG. 1(D) a CVD SiO$_2$ film 6 is deposited to fill the narrow groove 5. At this time, a groove 7 is formed in the CVD SiO$_2$ film in a portion thereof over the narrow groove 5 mentioned above. Thereafter, a film 8 which has fluidity and can be etched at the same rate as the CVD SiO$_2$ film is formed to fill the groove 7 thereby providing a flat surface.

Subsequently, the fluid film 8 and CVD SiO$_2$ film 6 are etched away, and further etching is carried out to expose the silicon in the element formation region. As a result, a substantially flat field region 9 consisting of the CVD SiO$_2$ film and plasma CVD SiO$_2$ film is formed, as shown in FIG. 1(E). A desired element is then formed in the element formation region 10 by the ordinary method.

In the above BOX method, the dimensions of the element region are defined solely by the dimensions of the mask formed for the photoetching process if reactive ion etching (RIE) which is free from side etching is used for the etching of the silicon substrate. Thus, it is possible to reduce the dimensional error of the element formation region to zero. In addition, a structure having a perfectly flat surface can be obtained, so that it is possible to increase the precision in the subsequent lithography and extremely improve the reliability of leads.

Problems, however arises with the prior art BOX method in case when forming a diffusion layer 11 (for instance of N$^+$-type) in the element region 10, then forming an insulating film 12 and an opening or hole 13 in the film by using ordinary lithography and electrically connecting a metal lead 14 and the diffusion layer 11 by making use of the hole 13, as shown in FIG. 2.

To form the hole 13 over the diffusion layer 11 as in FIG. 2, it is necessary to provide a mask register margin in the lithographic techniques. Recent trend for forming finer semiconductor elements, however, demands a very small width of the hole 13. In practice, however, it is technically difficult to form hole 13 having such a small width.

To alleviate the problems in the lithography of forming holes as discussed above, it may be thought to form the hole 13 such that it partly overlap the diffusion layer 11 and field region 9 as shown in FIG. 3A. By so doing, the semiconductor device integration density may be promoted.

However, where the hole 13 is formed to partly overlap the field region 9, part 14 of the field oxide film 9 is also etched away at the time of the hole formation as shown in FIG. 3(B). Therefore, abnormal electric connection of a subsequently formed metal lead and the silicon substrate is liable to result.

Serious restriction, therefore, is imposed on the integration density of the semiconductor device due to limitations on the size of holes for obtaining electric connection of metal leads although the dimensions of elements may be reduced by the BOX method.

SUMMARY OF THE INVENTION

This invention has been made in view of the drawbacks inherent in the prior art inter-element isolation method using oxide film. Its object, accordingly, is to provide a method of manufacturing a semiconductor devive, in which an insulating film of a different substance than oxide film is formed along an area neighboring an element formation region, thus permitting the formation of a hole partly overlapping a field region thereby increasing the semiconductor device integration density.

A first aspect of the invention lies in providing a semiconductor device of the type in which a field region between adjacent element regions formed in a semiconductor substrate is constituted by a buried oxide film having the top surface substantially flush with the top surface of the element regions and lead layer is electrically connected to each element region by making use of a hole formed in an insulating film formed to cover the element region and field region, which is characterized in that a second insulating film consisting of a different substance having a lower etching rate than the first-mentioned insulating film is formed at a boundary space between the field region and each element region, said hole being formed to overlap each element region and the second insulating film.

A second aspect of the invention lies in providing a method of manufacturing a semiconductor device, which comprises a step of forming a recess in a portion of a semiconductor substrate corresponding to a field region, a step of forming a first insulating film in said recess such that a groove is defined at the edge of the first insulating film, a step of forming a second insulating film over the entire surface to fill the groove, a step of exposing portions of the substrate corresponding to . element formation regions while leaving the first and second insulating films in the recess, a step of forming each element formation region with an impurity-doped surface region adjacent to the field region, a step of forming over the entire surface a third insulating film of a different substance having a higher etching rate than the second insulating film, and a step of forming through the third insulating film a contact hole for electrically connecting a lead to the impurity-doped region such that the contact hole partly overlaps the second insulating film in the recess.

There are two main points in the invention. The first point is that for burying in an insulating film in the field region by the usual BOX method, a first insulating film (for instance, a CVD silicon oxide film) is formed by the well-known lift-off process. A second insulating film of a substance, which has a selective etching property with respect to a third insulating film is subsequently formed on the aforementioned first and second insulating films. This film has a substantially lower etching rate with respect to the third insulating film in a particular etching method, for instance alumina, silicon nitride or tantalum oxide, and is formed in a V-shaped groove defined at the boundary defined between the first insulating film and an element formation region formed by the lift-off process. The second point is that it has been made possible to obtain an electric connection between the impurity-doped layer in the element formation region and a lead through a contact hole which is formed in the third insulating film in such a manner that the hole partly overlaps the second insulating film in the field region, thus alleviating restrictions on the dimensions of the hole.

According to the invention, the element formation region is thus surrounded by the second insulating film which has a lower etching rate than the third insulating film. Thus, when forming the hole partly overlapping the field region, the etching can be stopped at the surface of the second insulating film in the field region. That is, it is possible to avoid overetching of the field oxide film as shown in FIG. 3(B), thus eliminating abnormal electric connection between a subsequently formed lead and substrate, thereby increasing the reliability of the electric connection between diffusion layer and lead substance in the hole.

Further, the presence of the second insulating film makes it possible to use a different insulating film from that of the conventional oxide film as a gate insulating film that is provided underneath a gate electrode of a semiconductor device, for instance alumina film, silicon nitride film or tantalum oxide film. In that case, the gate insulating film may be made of the same substance as the second insulating film formed in a portion of the field region adjacent to the element formation region, so that it is possible to prevent charge trap in the junction between these two layers.

Particularly, where a P type substrate is used as the silicon substrate, by forming an alumina film as the second insulating film adjacent to the element formation region, the inversion of the silicon substrate at the interface between the alumina film and silicon substrate can be prevented, because the alumina film has a characteristic of being negatively charged.

DETAILED DESCRIPTION OF THE PREFERRED EMBODIMENT

Now, an embodiment of the invention applied to a MOS semiconductor device will be described with reference to FIGS. 4(A) through 4(F), 5 and 6.

Figure 4A:
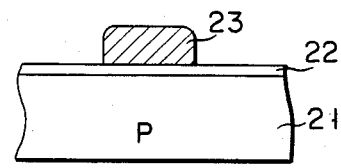
FIGS. 4(A) through 4(F) are sectional views illustrating steps of manufacturing a semiconductor device by the method according to this invention.

As shown in FIG. 4(A), a P-type silicon substrate 21 of surface orientation (100) and having a resistivity of 5 to 5 Ω·cm is prepared, and a thermal oxide film 22 is formed thereon to a thickness of about 500 Å. Then, a resist film 23 is formed to cover the element formation region by the ordinary photoetching process.

Figure 4B:
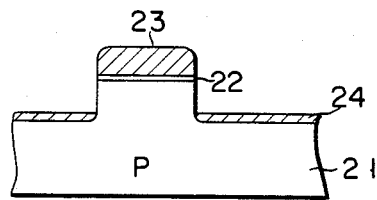

Then, as shown in FIG. 4(B) a portion of the silicon substrate constituting a field region is etched to a depth of, for instance 0.6 μm with the resist film 22 as a mask. Then, boron for field inversion prevention is ion-implanted into silicon in the field region by using the same mask, thus forming a P+-type layer 24.

Figure 4C:
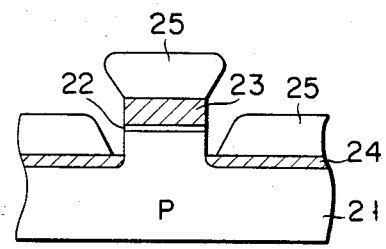

Then, as shown in FIG. 4(C) a plasma CVD SiO$_2$ film is deposited over the entire surface of the wafer, and side portions formed at the boundary between the field region and element formation region are selectively removed by the lift-off process using, for instance, ammonium fluoride.

Figure 4D:
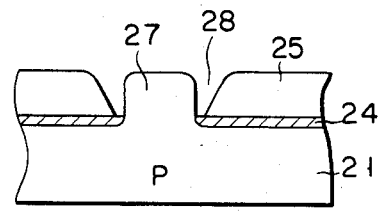
Figure 4E:
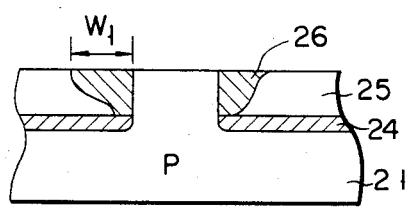

The resist film 23 is then etched away with a mixture of sulfuric acid and hydrogen peroxide together with the plasma CVD SiO$_2$ film thereon as shown in FIG. 4(D), leaving the plasma CVD SiO$_2$ film as a first insulating film 25 in the field region with a V-shaped groove 28 defined at the perimeter thereof. Subsequently, a second insulating film of a substance other than the first insulating film, for instance an alumina film, is uniformly deposited. A substance for providing a flat surface, typically a resist film (not shown), is then coated on the surface. Then, the resist film and alumina film are uniformly etched away, whereby a flat field region including the second insulating film 26 filling the groove 28 is obtained as shown in FIG. 4(E).

Figure 4F:
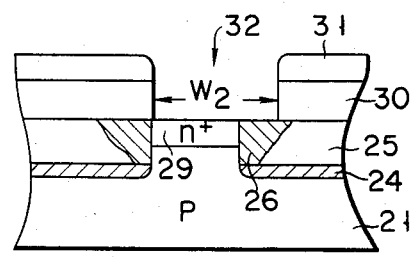

Then, as shown in FIG. 4(F) a diffusion layer 29 of a given type (for instance N+-type) is formed in the element region 27, and a third insulating film 30, which can be etched at a rate substantially higher than that of the second insulating film 26, for instance a CVD SiO$_2$ film, is formed over the entire surface. Then, a resist pattern 31 is formed on the insulating film 30, and with this pattern as a mask a hole (i.e., contact hole) 32 is formed in the film 30 by reactive ion etching using, for instance, an mixture gas containing CF$_4$ (or C$_3$F$_8$) gas and H$_2$ gas. The hole 32 is formed to partly overlap the diffusion layer 29 and second insulating film 26. At this time, the etching can be stopped at the surface of the second insulating film 26 because the etching rate of the insulating film 26 is substantially lower as compared to the third insulating film 30.

Figure 1A:
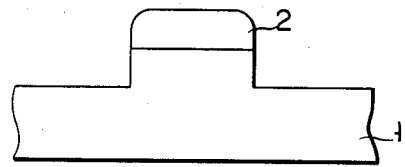
FIGS. 1(A) through 1(E) are sectional views for explaining an element isolation process based on the prior art BOX method.
Figure 1B:
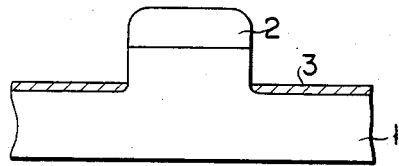
Figure 1C:
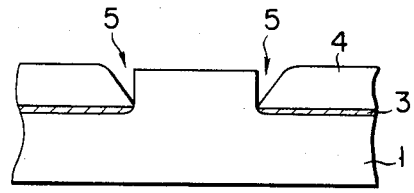
Figure 1D:
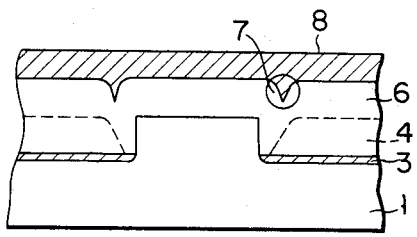
Figure 1E:
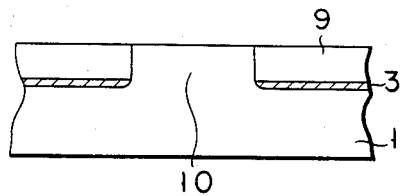
Figure 2:
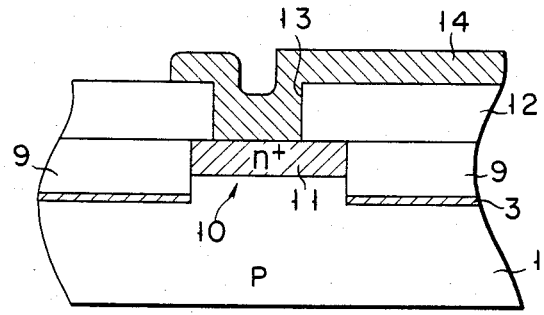
FIG. 2 is a sectional view showing a semiconductor device for explaining the prior art method of providing a metal lead in a contact hole.
Figure 3A:
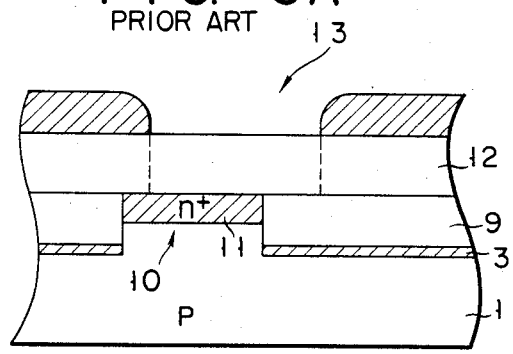
FIGS. 3(A) and 3(B) are sectional views for explaining problems encountered when forming a contact hole in a semiconductor device manufactured by the prior art BOX method.
Figure 3B:
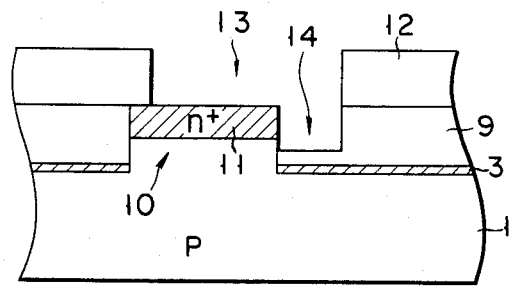

For this reason, the field insulating film is not etched during the formation of the hole 32 which partly overlaps the field region. The possibility of electric connection between metal lead and substrate as mentioned before, is thus eliminated, and the reliability of the electric connection between the electrode lead and diffusion layer in the hole can be extremely increased. In addition, the width W$_1$ of the surface of the second insulating film 26 (see FIG. 4(E)) can be made substantially equal to the thickness of the first insulating layer. Thus, the width W$_2$ of the hole (see FIG. 4(F)) can be given an increased margin of 2×W$_1$ at the most as compared to the prior art case described earlier in connection with FIG. 2. The precision required for the mask register for forming the hole 32 can thus be extremely alleviated compared to the prior art. It is thus possible to improve the semiconductor device integration density without spoiling the features of the conventional BOX method.

The P+-type layer 24 for inversion prevention may be omitted in some cases. For example, where the second insulating film 26 is an alumina film, there is no need for forming the P+-type layer 24 at the boundary between the alumina film and silicon substrate. This is because in this case no parasitic channel due to inversion is produced, because the alumina film tends to be negatively charged.

Figure 5:
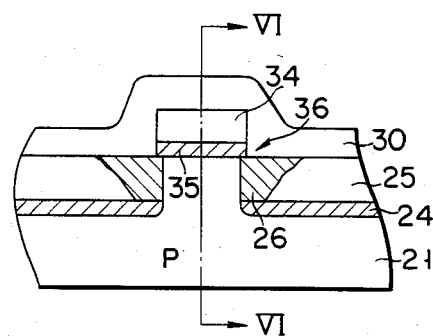
FIG. 5 is a sectional view showing a different embodiment of the semiconductor device according to the invention.
Figure 6:
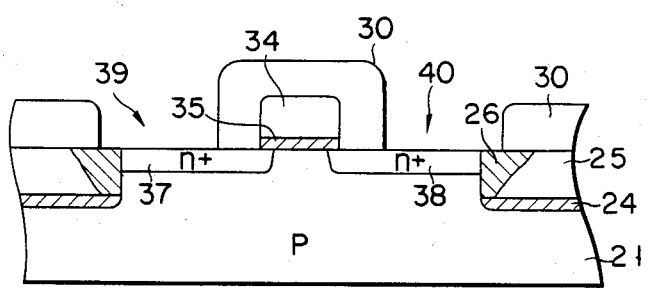
FIG. 6 is a sectional view taken along line VI—VI in FIG. 5.

FIGS. 5 and 6 illustrate advantages of the invention in case where a gate insulating film 35 which is provided underneath a gate electrode 34 of a MOS device is made of a different insulating film from the prior art silicon oxide film, for instance a silicon nitride film, an alumina film or a tantalum oxide film. In the device of FIG. 5, the second insulating film 26 is formed by using the same substance as the gate insulating film 35. Since in this case the gate insulating film 36 and second insulating film 25 defining a junction 36 between them are made of the same substance, there is no possibility of charge traps at the junction 36, which is very desirable from the standpoint of the characteristics of the element. FIG. 6 is a section taken along line VI—VI in FIG. 5. As is shown, holes 39 and 40 for source 37 and drain 38 may also be formed to partly overlap the second insulating film 26. In FIGS. 5 and 6, the other reference numerals designate like parts as in FIG. 4(F).

The invention is naturally applicable for interelement isolation not only for a MOS device but also for a bipolar semiconductor device.

What is claimed is:

1. A method of manufacturing a semiconductor device wherein a contact hole to a doped region is formed comprising the steps of:

forming a recess in a portion of a semiconductor substrate corresponding to a field region;

forming a first insulating film in said recess such that a groove is defined at the edge of said first insulating film;

forming a second insulating film over the entire surface to fill said groove;

exposing portions of said substrate corresponding to element formation regions while leaving said first and second insulating films in said recess;

forming said element formation region with an impurity-doped surface region adjacent to said field region;

forming over the entire surface a third insulating film of a different substance having a higher etching rate than said second insulating film; and forming through said third insulating film a contact hole for electrically connecting a lead to said impurity-doped region such that said contact hole partly overlaps said second insulating film in said recess.

2. The method according to claim 1, wherein said step of forming the groove for the field region includes burying said oxide film in said field region.

3. The method according to claim 2, wherein said second insulating film is selected from a group consisting of an alumina film, a silicon nitride film and a tantalum oxide film, and said third insulating film is a SiO$_2$ film.

* * * * *